United States Patent [19]

Murao

[11] Patent Number: 5,518,962
[45] Date of Patent: May 21, 1996

[54] PLANARIZED INTERLAYER INSULATING FILM FORMED OF STACKED BPSG FILM AND OZONE-TEOS NSG FILM IN SEMICONDUCTOR DEVICE AND METHOD FOR FORMING THE SAME

[75] Inventor: Yukinobu Murao, Tokyo, Japan

[73] Assignee: NEC Corporation, Tokyo, Japan

[21] Appl. No.: 411,390

[22] Filed: Mar. 28, 1995

Related U.S. Application Data

[62] Division of Ser. No. 157,319, Nov. 26, 1993, abandoned.

[30] Foreign Application Priority Data

Nov. 26, 1992 [JP] Japan ..................... 4-317005

[51] Int. Cl.$^6$ ................................. H01L 21/283
[52] U.S. Cl. ................ 437/195; 437/228; 437/238; 437/978
[58] Field of Search ...................... 257/644, 650, 257/758, 760; 437/195, 238, 240, 978, 193, 200, 228 PL

[56] References Cited

U.S. PATENT DOCUMENTS

| | | | |
|---|---|---|---|
| 4,676,867 | 6/1987 | Elkins et al. | 156/643 |
| 4,795,722 | 7/1989 | Welch et al. | 437/192 |
| 4,807,016 | 2/1989 | Douglas | 257/764 |
| 4,966,865 | 10/1990 | Welch et al. | 437/192 |
| 5,110,763 | 5/1992 | Matsumoto | 437/195 |
| 5,132,774 | 7/1992 | Matsuura et al. | 357/71 |
| 5,250,468 | 10/1993 | Matsuura et al. | 437/194 |
| 5,278,103 | 1/1994 | Mallon et al. | 437/240 |
| 5,286,681 | 2/1994 | Maeda et al. | 437/240 |
| 5,326,989 | 7/1994 | Muragishi | 257/649 |
| 5,403,780 | 4/1995 | Jain et al. | 437/195 |

FOREIGN PATENT DOCUMENTS

| | | |
|---|---|---|
| 0249173 | 12/1987 | European Pat. Off. . |
| 0537364 | 4/1993 | European Pat. Off. . |
| 4100525 | 8/1991 | Germany . |
| WO92/19011 | 10/1992 | WIPO . |

OTHER PUBLICATIONS

N. Shimoyama et al., "Enhanced Hot–Carrier Degradation due to Water in TEOS/O$_3$–Oxide and Water Blocking Effect of ECR–SiO$_2$", 1992 Symposium on VLSI Technology Digest of Technical Papers, pp. 94–95.

Primary Examiner—T. N. Quach
Attorney, Agent, or Firm—Sughrue, Mion, Zinn, Macpeak & Seas

[57] ABSTRACT

A semiconductor device formed at a substrate surface region is coated with a non-doped CVD silicon oxide film, and an interlayer insulating film composed of a BPSG film, a first ozone-TEOS NSG film and a second ozone-TEOS NSG film is formed on the silicon oxide film. The BPSG film has a thickness of not less than 50 nm but not greater than 200 nm, and is heat-treated at a temperature of not lower than 700° C. but not higher than 800° C. In addition, the first and second zone-TEOS NSG films are also heat-treated at a temperature of not lower than 700° C. but not higher than 800° C.

7 Claims, 7 Drawing Sheets

PLANARIZED INTERLAYER INSULATING FILM FORMED OF STACKED BPSG FILM AND OZONE-TEOS NSG FILM IN SEMICONDUCTOR DEVICE AND METHOD FOR FORMING THE SAME

This is a Divisional of application No. 08/157,319 filed Nov. 26, 1993, abandoned.

BACKGROUND OF THE INVENTION

1. Field of the Invention

The present invention relates to a semiconductor device and a method for manufacturing the same. More specifically, the present invention relates to an interlayer insulating film formed between a lower level wiring conductor layer formed of a refractory conductor material and an upper level wiring conductor formed of an aluminum type metal film.

2. Description of Related Art

In a conventional semiconductor device, such as a MOS semiconductor device, having an upper level wiring conductor formed of an aluminum type metal film, an interlayer insulating film formed of a BPSG (borophosphosilicate glass) film has been widely used. For example, this MOS semiconductor device has been essentially manufactured as follows: A semiconductor device having a diffusion layer and a polysilicon wiring conductor at a silicon substrate surface is formed, and a non-doped insulating film is formed on a whole surface of the substrate. Thereafter, a BPSG film is formed on a whole surface of the non-doped insulating film. The non-doped insulating film is provided for the purpose of preventing phosphorus or boron contained in the BPSG film from being diffused into the diffused layer. The BPSG film is reflowed by a heat-treatment for example in a nitrogen or steam atmosphere at a temperature on the order of 900° C., so that the surface is smoothed. In order to reflow the BPSG film, a temperature of not less than 850° C. is required. An opening is formed through the BPSG film and the non-doped insulating film, and an upper level wiring conductor composed of an aluminum type metal film is formed. A main mason for adopting the BPSG film as the interlayer insulating film lies on a gettering property and on a reflow property.

With advanced microminiaturization of semiconductor devices, a problem occurs in connection with the reflow of the BPSG film in the case that the interlayer insulating film is formed of only the BPSG film.

Now, referring to FIGS. 1A and 1B which are sectional views of a semiconductor device, and to FIG. 2 which is a graph showing a step coverage of the BPSG film, explanation will be made on the fact that when a BPSG film is deposited, a void occurs dependently upon the step coverage of the BPSG film.

Firstly, as shown in FIG. 1A, a silicon oxide film 211A is formed on a P-type silicon substrate 201A, and a polysilicon gate electrode 206A is formed on the silicon oxide film 211A. Then, a BPSG film 220 of a thickness "b" is formed on the whole surface. This case will be now examined. The concentration of each of phosphorus and boron contained in this BPSG film 220 is 5 mol %. Here, it is assumed that a minimum thickness of the BPSG film formed on a side surface of the polysilicon gate electrode 206A is "a". In this case, a factor "a/b" is a parameter showing the step coverage, and the dependency of the parameter "a/b" upon the thickness "b" of the BPSG film 220 is as shown in FIG. 2. Namely, when the thickness "b" of the BPSG film 220 is not greater than 200 nm, the step coverage of the as-deposited film is excellent, but when the thickness "b" of the BPSG film 220 is greater than 200 nm, the step coverage of the as-deposited film degrades accordingly. However, if the thickness "b" of the BPSG film 220 is not greater than 200 nm, a stray capacitance which formed between the polysilicon gate electrode and the upper level wiring conductor composed of aluminum type metal film becomes unfavorably large.

Next, the case that the thickness "b" of the BPSG film 220 is larger than 200 nm, will be examined. As shown in FIG. 1B, a silicon oxide film 211B is formed on a P-type silicon substrate 201B, and a plurality of polysilicon gate electrodes 206B are formed on the silicon oxide film 211B with intervals of 0.5 μm. Then, a BPSG film 221 having a thickness of for example 250 nm is formed on the whole surface. The concentrations of phosphorus and boron contained in the BPSG film 221 are the same as those of the phosphorus and the boron contained in the BPSG film 220, respectively. In this case, if the step coverage is excellent, the surface of the as-deposited BPSG film 221 should be substantially planar. Actually, however, voids 215 occur in the as-deposited BPSG film 211, as will be readily understood from the result shown in FIG. 2.

These void 215 will disappear when the BPSG film 211 is reflowed. For this reflow treatment, a temperature of not less than 850° C. is required as mentioned hereinbefore. However, if the heat-treatment is performed at a temperature of not less than 800° C., a depth of junction will increase in source/drain regions of a MOS transistor, with the result that a so-called short channel effect becomes large. This phenomenon is remarkable, particularly in a P-channel MOS transistor. Because of this reason, the interlayer insulating film formed of the reflowed BPSG film is not suitable in a semiconductor integrated circuit including microminiaturized semiconductor devices.

Recently, as an insulating film having an excellent step coverage, attention is focused on a non-doped silicon oxide film formed by a chemical vapor deposition process using ozone ($O_3$) and tetraethoxysilane ($Si(OC_2H_5)_4$, called "TEOS" hereinafter). This non-doped silicon oxide film will be called an "ozone-TEOS NSG film" hereinafter. Here, "NSG" is an abbreviation of a "non-doped silicate glass".

However, if the interlayer insulating film is formed of only the ozone-TEOS NSG film, other problems will occur. One of the other problems is that the ozone-TEOS NSG film itself has no gettering function. In addition, the as-deposited ozone-TEOS NSG film has a high moisture content, and therefore, a heat-treatment is required. During the heat-treatment, however, the moisture moves to the semiconductor devices. Therefore, if the interlayer insulating film is formed of only the ozone-TEOS NSG film, an electrical characteristics of the semiconductor devices is deteriorated.

SUMMARY OF THE INVENTION

Accordingly, it is an object of the present invention to provide a semiconductor device and a method for manufacturing the same, which have overcome the above mentioned defect of the conventional one.

Another object of the present invention is to provide an interlayer insulating film which has a gettering function and an excellent planarized surface and which never deteriorates the electrical characteristics of semiconductor devices, in a semiconductor integrated circuit including microminiaturized semiconductor devices, and a method for manufacturing such an interlayer insulating film.

The above and other objects of the present invention are achieved in accordance with the present invention by a semiconductor device having at least a diffusion layer and a polysilicon wiring conductor formed at a silicon substrate surface, a lower level wiring conductor layer including at least the diffusion layer, wherein the improvement is that an interlayer insulating film between the lower level wiring conductor layer and an upper level wiring conductor includes an interlayer insulating film having a planarized surface, which includes at least a BPSG film and a non-doped silicon oxide film deposited on the BPSG film by a chemical vapor deposition process using ozone and tetraethoxysilane.

Preferably, the BPSG film has a thickness of not less than 50 nm but not greater than 200 nm.

According to another aspect of the present invention, there is provided a method for manufacturing a semiconductor device, comprising the steps: forming a semiconductor device having a diffusion layer and a polysilicon wiring conductor at a silicon substrate surface, and forming a non-doped insulating film on a whole surface of the substrate; forming, on the non-doped insulating film, a BPSG film having a thickness of not less than 50 nm but not greater than 200 nm, and then, performing a first heat-treatment; forming, on the BPSG film, a non-doped silicon oxide film by a chemical vapor deposition process using ozone and tetraethoxysilane, and then, performing a second heat-treatment; forming an insulative dummy layer on a surface of the non-doped silicon oxide film, and then, performing an etching-back treatment until the insulative dummy layer is completely removed, so that a surface of the non-doped silicon oxide film is planarized; forming openings through the BPSG film and the non-doped silicon oxide film so as to reach the diffusion layer and the polysilicon wiring conductor, respectively; and forming an upper level wiring conductor formed of an aluminum type metal film on the planarized non-doped silicon oxide film, in contact with the diffusion layer and the polysilicon wiring conductor through the openings, respectively.

Preferably, each of the first and second heat-treatments is performed at a temperature of not lower than 700° C. but not higher than 800° C.

The above and other objects, features and advantages of the present invention will be apparent from the following description of preferred embodiments of the invention with reference to the accompanying drawings.

DESCRIPTION OF THE PREFERRED EMBODIMENTS

Now, the present invention will be described with reference to the drawings.

Figure 3A:
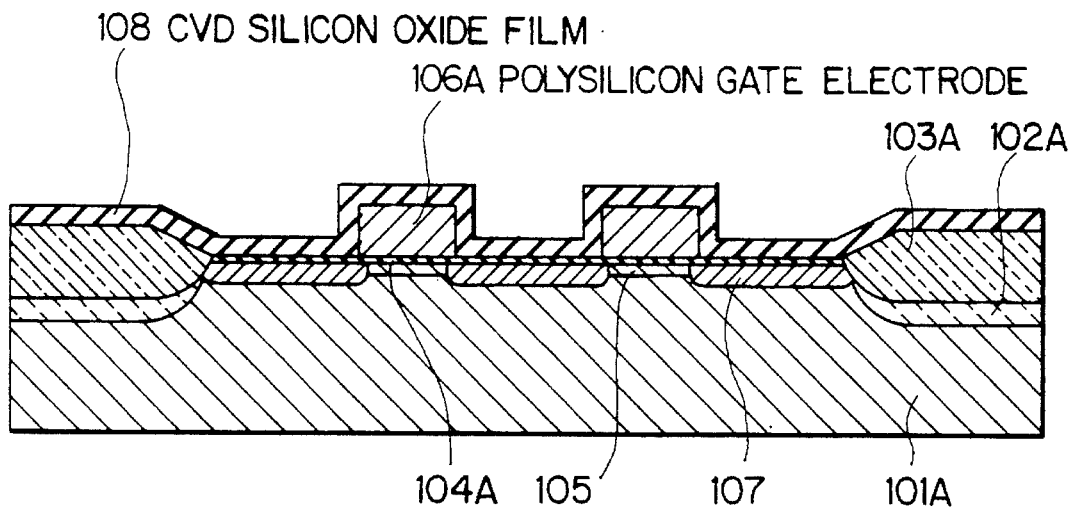
FIGS. 3A to 3D are sectional views for illustrating the manufacturing process of the first embodiment of the present invention.

Referring to sectional views of FIGS. 3A to 3D illustrating the manufacturing process of the semiconductor device, a first embodiment of the present invention will be formed as follows:

As shown in FIG. 3A, on a principal surface of a P-type silicon substrate 101A having a specific resistance on the order of 1 Ω.cm, there is formed a device isolation region composed of a P-type channel stopper 102A and a field oxide film 103A having a thickness on the order of 500 nm. In a device formation region defined or surrounded by the device isolation region, a gate oxide film 104A having a thickness on the order of 15 nm is formed on the principal surface of the silicon substrate 101A. In addition, a channel doped layer 105 is also formed by ion-implanting boron at the dose on the order of $3 \times 10^{12}$ cm$^{-2}$ to the principal surface of the silicon substrate 101A. An opening (not shown) is formed at predetermined positions of the gate oxide film 104A.

Next, an N$^+$ polysilicon film having a thickness on the order of 300 nm is formed on the whole surface of the substrate, and then, patterned by a conventional photolithography and dry etching so as to form polysilicon gate electrodes 106A having a gate length (=L) of 0.4 μm. Thereafter, by using the gate electrodes 106A as a mask, phosphorus is ion-implanted at the dose on the order of $1 \times 10^{13}$ cm$^{-2}$ with an acceleration energy on the order of 30 KeV, so as to form an N$^-$ diffusion layer 107 at the principal surface of the P-type silicon substrate 101A. Furthermore, a non-doped CVD silicon oxide film 108 having a thickness on the order of 150 nm is formed on the whole surface at a deposition temperature of 800° C. (FIG. 3A).

Figure 3B:
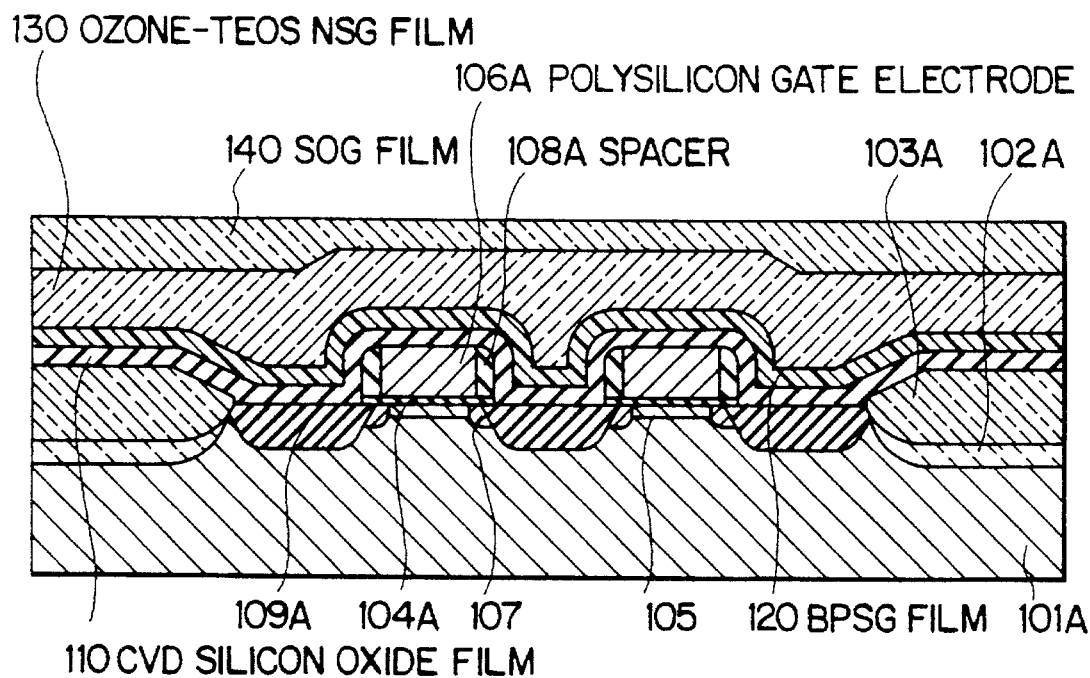

Then, the CVD silicon oxide film 108 is etched back by an anisotropic dry etching, so that a spacer 108A formed of the CVD silicon oxide film 108 is formed on each side surface of the polysilicon gate electrodes 106A, as shown in FIG. 3B. In addition, by using the gate electrodes 106A having each side surface coated with the spacer 108A as a mask, arsenic is ion-implanted at the dose on the order of $5 \times 10^{15}$ cm$^{-2}$ with an acceleration energy on the order of 30 KeV, so as to form an N$^+$ diffusion layer 109A at the principal surface of the P-type silicon substrate 101A.

Furthermore, a non-doped CVD silicon oxide film 110 having a thickness on the order of 50 nm is formed on the whole surface. This CVD silicon oxide film 110 is provided to prevent phosphorus or boron from being diffused from a BPSG film formed in a next step, into the silicon substrate 101 or the N$^-$ diffusion layer 107 and the N$^+$ diffusion layer 109A.

Thereafter, a BPSG film 120 having a thickness on the order of 100 nm is formed by a CVD process. In this BPSG film 120, the concentration of boron is about 5 mol % and the concentration of phosphorus is about 5 mol %. The thickness of this BPSG film 120 is preferably not less than 50 nm but not greater than 200 nm.

Figure 2:
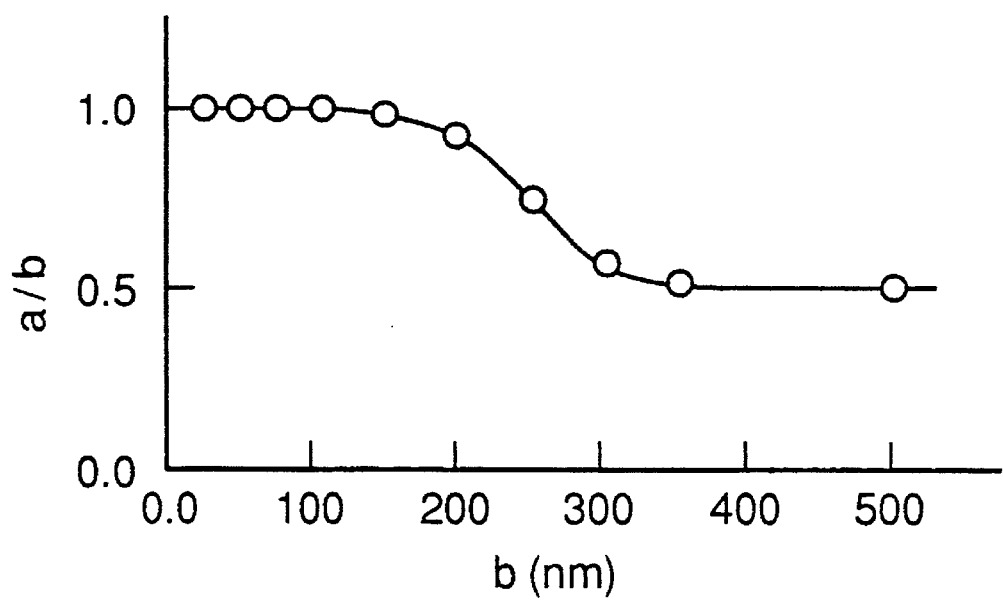
FIG. 2 is a graph showing the step coverage of the BPSG film, for illustrating the problem of the conventional semiconductor device.

The upper limit of the thickness of the BPSG film 120 is attributable to the following: As shown in FIG. 2, if the film thickness is not greater than 200 nm, the step coverage of the BPSG film is excellent, but if the film thickness is greater than 200 nm, the step coverage of the BPSG film degrades accordingly. On the other hand, the lower limit of the thickness of the BPSG film 120 is attributable to the following: The BPSG film 120 getters external impurities such as sodium, so that the BPSG film 120 functions as a passivation film for protecting the semiconductor device. The BPSG film is required to have the thickness of at least 50 nm in order to function as the passivation film.

Then, a first heat-treatment is performed on this BPSG film 120 at a temperature of not lower than 700° C. but not higher than 800° C. The reason for performing the heat-treatment at a temperature of not higher than 800° C. is to prevent increase of the depth of junction in the $N^+$ diffusion layer 109A. With this feature, it is possible to suppress increase of a short-channel effect of, for example, a MOS transistor. In addition, the reason for performing the heat-treatment at a temperature of not less than 700° C. is to remove moisture contained in the as-deposited BPSG film. This first heat-treatment is not for the purpose of reflowing the BPSG film.

Next, an ozone-TEOS NSG film 130 is formed on the whole surface by a chemical vapor deposition process (atmospheric pressure CVD) at a temperature of 400° C., using ozone ($O_3$) and TEOS ($Si(OC_2H_5)_4$). The flow rate of {ozone:TEOS} is 10:1. A planar property of the as-deposited ozone-TEOS NSG film 130 will be discussed hereinafter. Succeedingly, a second heat-treatment is performed at a temperature of not lower than 700° C. but not higher than 800° C. The temperature range of this second heat-treatment will be also discussed hereinafter.

Thereafter, an SOG film (spin on glass) 140 is coated on the whole surface. This SOG film 140 has a thickness on the order of 300 nm at its thickest portion. The SOG film 140 is baked at a temperature of 100° C., and thereafter, a heat-treatment is performed in a nitrogen ($N_2$) atmosphere at a temperature of 400° C. (FIG. 3B).

Figure 3C:
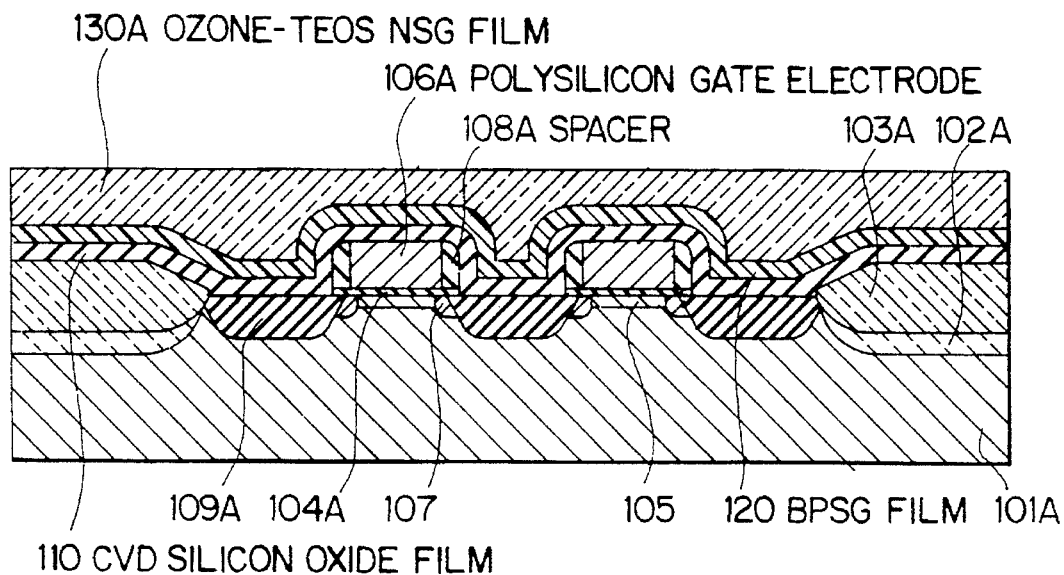

Then, an etching-back treatment is performed until the SOG film 140 is completely removed. With this treatment, the ozone-TEOS NSG film 130 becomes a ozone-TEOS NSG film 130a having a planarized surface, as shown in FIG. 3C. Here, in place of the SOG film 140, a photoresist film can be formed on the ozone-TEOS NSG film 130, and then, an etching-back treatment can be performed.

Figure 3D:
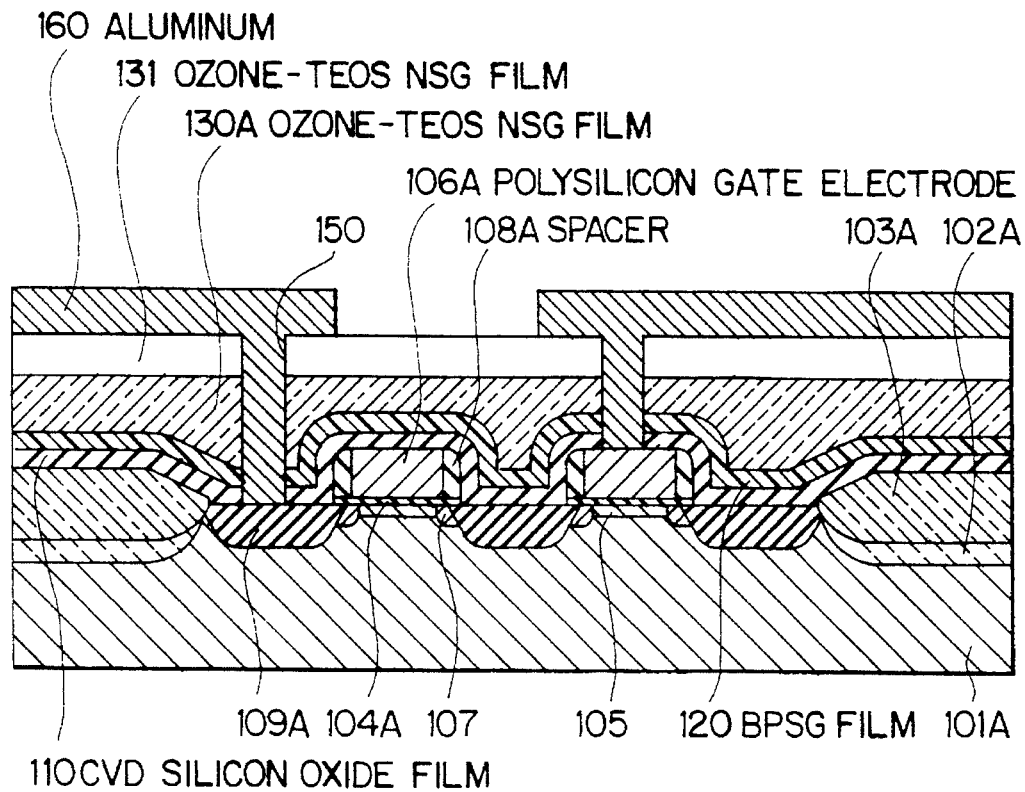

Here, openings may be formed at a predetermined position to reach the polysilicon gate electrode 106A and at another predetermined position to reach the $N^+$ diffusion layer 109A, respectively. However, the surface of the ozone-TEOS NSG film 130a has minute convexities and concaves because of the etching-back treatment. Therefore, it is more preferable to relax or smoothen the minute convexities and concaves. For this purpose, another ozone-TEOS NSG film 131 having a thickness on the order of 20 nm is formed on the whole surface. This ozone-TEOS NSG film 131 has a planar surface in an as-deposited condition. Succeedingly, a heat-treatment is performed under the same condition as that of the above mentioned second heat-treatment. Thus, an interlayer insulating film formed of the BPSG film 120, the ozone-TEOS NSG film 130 and the ozone-TEOS NSG film 131 which are deposited and stacked in the named order, is completed as shown in FIG. 3D. Here, in place of the ozone-TEOS NSG film 131, a BPSG film can be formed and a heat-treatment is performed under the same condition as that of the above mentioned first heat-treatment. Alternatively, a SOG film can be coated and baked, in place of the ozone-TEOS NSG film 131.

Thereafter, openings 150 are formed at a predetermined position to reach the polysilicon gate electrode 106A and at another predetermined position to reach the $N^+$ diffusion layer 109A, respectively. In addition, an upper level wiring conductor 160 formed of an aluminum type metal film is formed. Thus, a semiconductor device is completed.

Now, the planar property of the ozone-TEOS NSG film in the first embodiment will be explained with reference to FIGS. 4A and 4B which are sectional views of a semiconductor device.

Figure 1A:
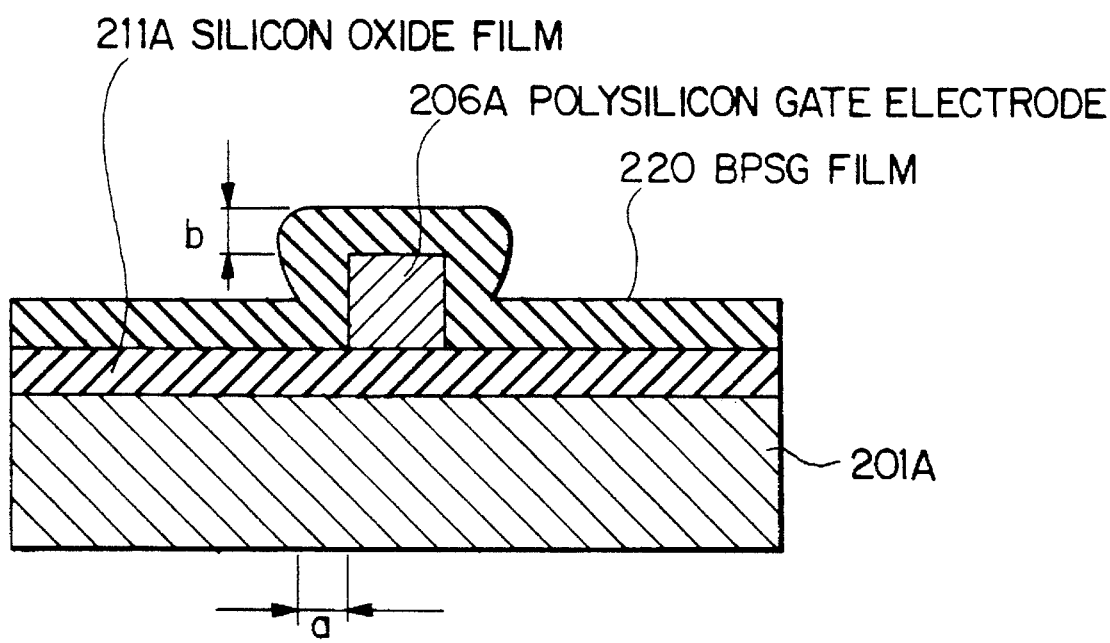
FIGS. 1A and 1B are sectional views for illustrating the problem of the conventional semiconductor device.
Figure 1B:
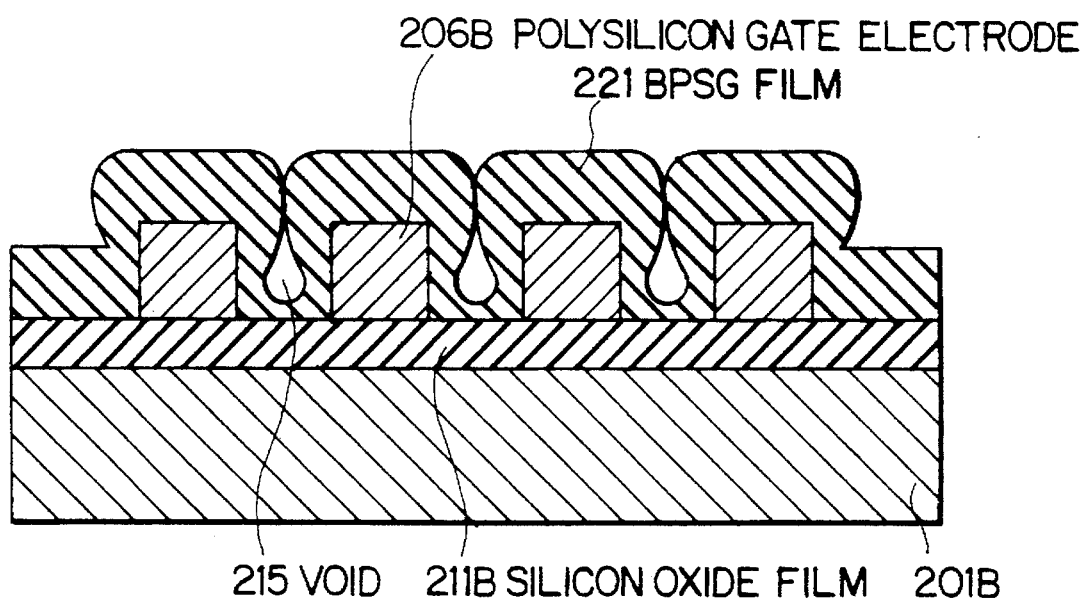
Figure 4A:
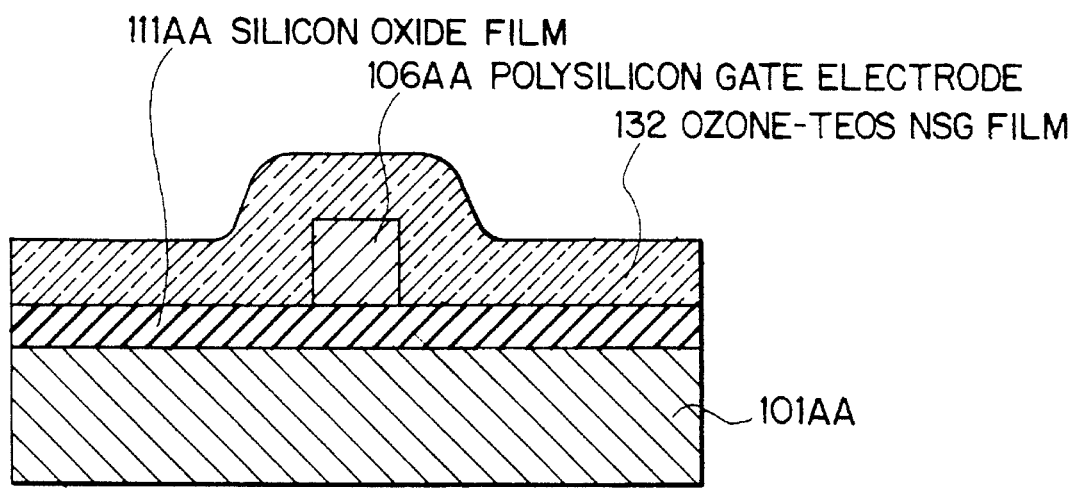
FIGS. 4A and 4B are sectional views for illustrating the advantage of the first embodiment of the present invention.
Figure 4B:
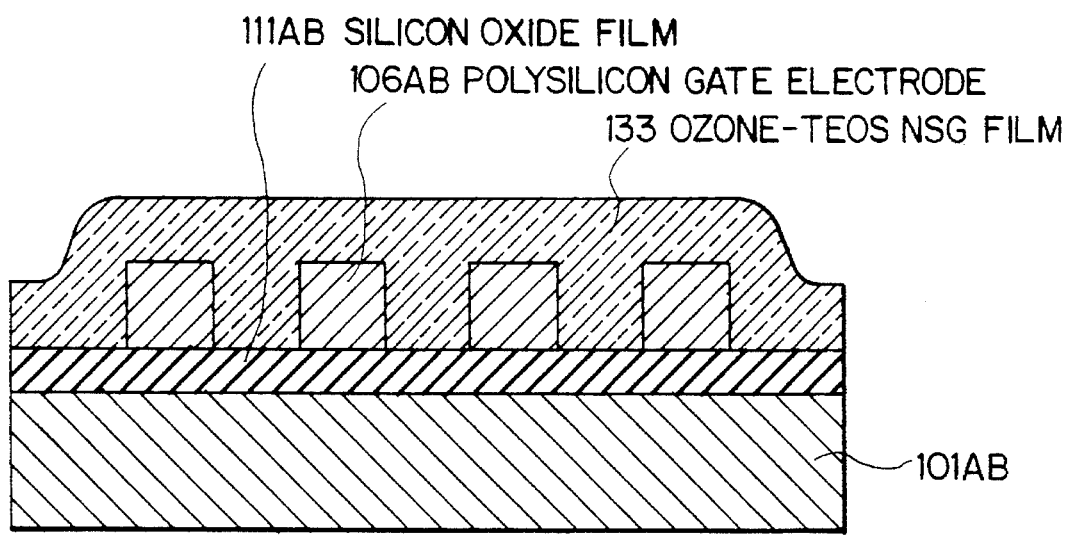

As shown in FIG. 4A, a silicon oxide film 111AA is formed on a P-type silicon substrate 101AA, and one polysilicon gate 106AA is formed on the silicon oxide film 111AA. Next, an ozone-TEOS NSG film 132 having a thickness on the order of 800 nm, which is sufficiently larger than the thickness of the BPSG film, is formed on the whole surface. Although this ozone-TEOS NSG film 132 has a large thickness, this ozone-TEOS NSG film 132 has an excellent step coverage in an as-deposited condition, differently from the BPSG film as shown in FIG. 1A. Therefore, even in the case that a silicon oxide film 111AB is formed on a P-type silicon substrate 101AB, and a plurality of polysilicon gates 106AB are formed on the silicon oxide film 111AB with intervals of 0.5 μm, and then, an ozone-TEOS NSG film 133 having a thickness of for example 800 nm is formed on the whole surface as shown in FIG. 4B, voids (which occurred in the BPSG film) do not occur. The as-deposited film has an excellent step coverage.

Figure 5:
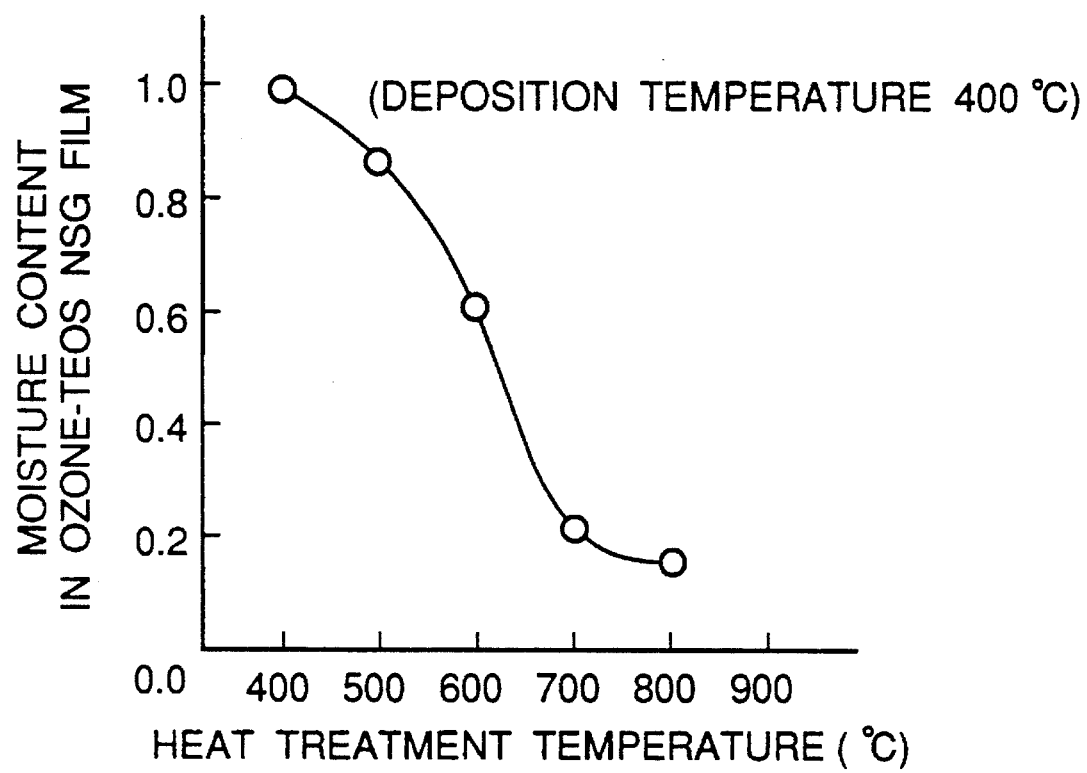
FIG. 5 is a graph showing the change of the moisture content ratio of the ozone-TEOS NSG film dependent upon the heat-treatment temperature, for illustrating the first embodiment of the present invention.

Here, a supplementary explanation will be made on the limitation of the temperature in the second heat-treatment in the first embodiment. Since a reaction product of the chemical vapor deposition process using the ozone ($O_3$) and the TEOS ($Si(OC_2H_5)_4$ includes moisture ($H_2O$), the as-deposited ozone-TEOS NSG film has a high moisture content as mentioned hereinbefore. Accordingly, the heat-treatment becomes necessary. Referring to FIG. 5 showing a change of the moisture content ratio of the ozone-TEOS NSG film dependent upon a heat-treatment temperature (ratio of the moisture content of the heat-treated film to the moisture content of the as-deposited film deposited at 400° C.), it will be noted that it is necessary to perform the heat-treatment at a temperature of not lower than 700° C. (the BPSG film has a similar inclination). The graph of FIG. 5 was obtained by measuring an infrared absorptivity of OH group. In addition, the second heat-treatment at a temperature of not higher than 800° C. is intended to prevent increase of the depth of junction in the $N^+$ diffusion layer 109A and others, similarly to the upper limit of the temperature of the first heat-treatment.

Figure 6:
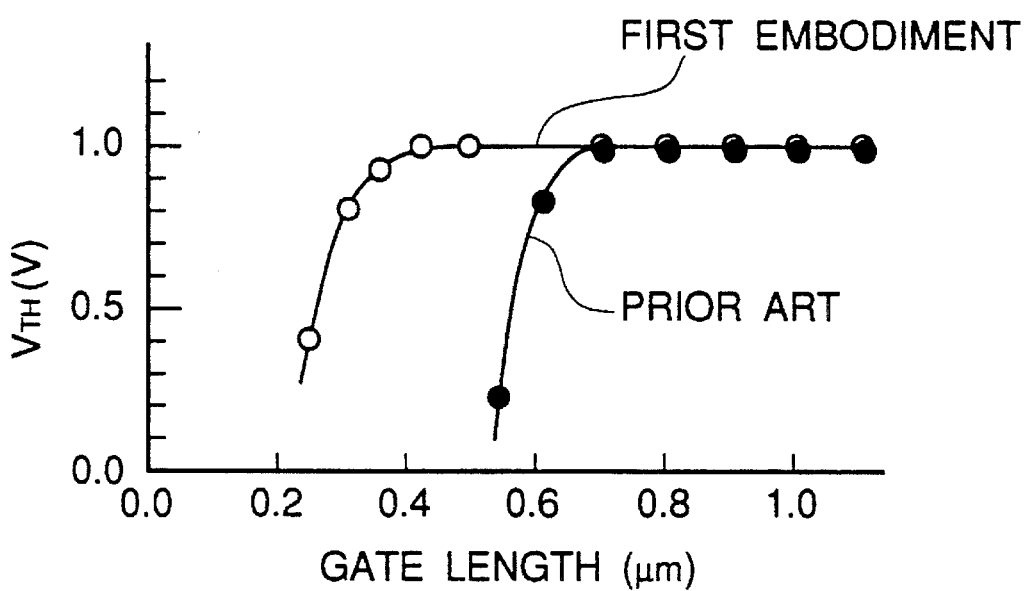
FIG. 6 a graph showing the dependency of the threshold voltage $V_{TH}$ of the N-channel MOS transistor upon the gate length L, for illustrating the first embodiment of the present invention.

Referring to FIG. 6 which is a graph showing the threshold voltage $V_{TH}$ of an N-channel MOS transistor dependent upon a gate length L, if the gate length L is not smaller than 0.4 μm in the N-channel MOS transistor of the above mentioned first embodiment, the short-channel effect is not remarkable. In the prior art, on the other hand, the gate length L of not smaller than 0.7 μm is required in order to suppress the short-channel effect.

Figure 7:
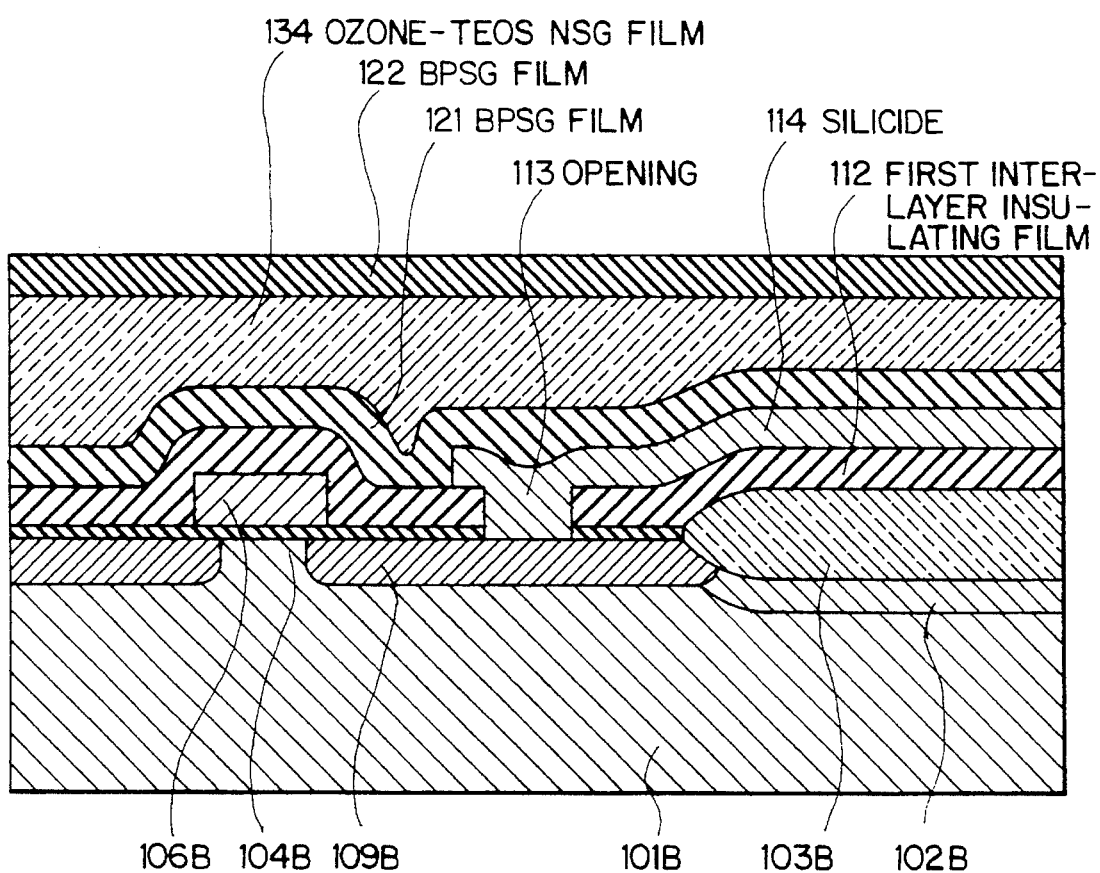
FIG. 7 is a sectional view for illustrating the second embodiment of the present invention.

Referring to FIG. 7 which is a sectional view of a semiconductor device, a second embodiment of the present invention is such that a lower level wiring conductor layer is composed of an $N^+$ diffusion layer 109B, a polysilicon gate electrode 106B formed of $N^+$ polysilicon film, and a silicide wiring conductor 114. In a surface of a P-type silicon substrate 101B, there are formed a device isolation region composed of a P-type channel stopper 102B and a field oxide film 103B, and a gate oxide film 104. The polysilicon gate electrode 106B is formed on the gate oxide film 104B. The polysilicon gate electrode 106B, the gate oxide film 104B and the field oxide film 103B are coated with a non-doped first interlayer insulating film 112. The silicide wiring conductor 114 is connected to the $N^+$ diffusion layer 109A through an opening 113 formed in the first interlayer insulating film 112. A second interlayer insulating film between the silicide wiring conductor 114 and an upper level wiring conductor (not shown) of an aluminum type metal film is formed by depositing a BPSG film 121, an ozone-TEOS NSG film 134 having a planarized surface, and another BPSG film 122 in the named order. The conditions for forming the BPSG film 121 and the ozone-TEOS NSG film 134 are the same as those for forming the BPSG film 120 and the ozone-TEOS NSG film 130 in the first embodiment, respectively.

In the above mentioned second embodiment, it is possible that the BPSG film 121 is in direct contact with a lower level wiring conductor, such as the silicide wiring conductor 114, which has no problem in connection with diffusion of conductive impurities. Therefore, the planar property of the surface of the second interlayer insulating film can be maintained. In addition, even if the lower level wiring conductor layer composed of a refractor conductor material includes a plurality of lower level wiring conductor layers having no problem in connection with diffusion of conductive impurities, this embodiment can be applied.

As mentioned above, the present invention is characterized in that an interlayer insulating film between a lower level wiring conductor layer formed of a refractory conductor material and an upper level wiring conductor formed of an aluminum type metal film, includes an interlayer insulating film having a planarized surface, which includes at least a BPSG film and an ozone-TEOS NSG film deposited on the BPSG film. Therefore, the reflow of the BPSG film becomes unnecessary, and therefore, the restriction on microminiaturization of the semiconductor device is reduced. In addition, since the BPSG film has a gettering function, although the ozone-TEOS NSG film is included in the interlayer insulating film, the deterioration of the electrical characteristics of the semiconductor device can be avoided.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a semiconductor device, comprising the steps of:

forming a diffusion layer and a polysilicon wiring conductor on a silicon substrate surface;

forming a non-doped insulating film on surfaces of said diffusion layer and said polysilicon wiring conductor, respectively;

forming, on said non-doped insulating film, a BPSG film having a thickness of not less than 50 nm but not greater than 200 nm;

performing a first heat-treatment on said BPSG film;

forming, on said BPSG film, a non-doped silicon oxide film by a chemical vapor deposition process using ozone and tetrethoxysilane;

performing a second heat-treatment on said non-doped silicon oxide film;

forming an insulative dummy layer on a surface of said non-doped silicon oxide film;

performing an etching-back treatment until said insulative dummy layer is completely removed, so that a surface of said non-doped silicon oxide film is planarized;

forming openings through said non-doped insulating film, said BPSG film, and said non-doped silicon oxide film so as to reach said diffusion layer and said polysilicon wiring conductor, respectively; and forming an upper level wiring conductor composed of a metal film on said planarized non-doped silicon oxide film, wherein said upper level wiring conductor is in contact with said diffusion layer and said polysilicon wiring conductor through said openings, respectively.

2. The method of claim 1, wherein each of said first and second heat-treatments is performed at a temperature of not lower than 700° C. but not higher than 800° C.

3. The method of claim 1, further comprising the step of:

forming an insulating film having a planar upper surface in an as-deposited condition on said planarized non-doped silicon oxide film after said etching-back treatment, and wherein said openings forming step further comprises the step of creating a path through said insulating film so as to reach said diffusion layer and said polysilicon wiring conductor, respectively.

4. The method of claim 3, wherein said insulating film is formed by coating and baking an SOG film on said surface of said non-doped silicon oxide film or by forming a photoresist film on said surface of said non-doped silicon oxide film.

5. The method of claim 1, further comprising the step of forming an oxide gate film between said silicon substrate and said diffusion layer.

6. A method for manufacturing a semiconductor device, comprising the steps of:

forming a lower level wiring conductor layer on a silicon substrate surface, said lower level wiring conductor including a diffusion layer and a polysilicon wiring conductor;

forming a non-doped insulating film on surfaces of said diffusion layer and said polysilicon wiring conductor;

forming an opening through said non-doped insulating film at a location of said diffusion layer to expose a portion thereof;

forming a silicide wiring conductor on a portion of said non-doped insulating film and in said opening such that said silicide wiring conductor contacts said portion of said diffusion layer;

forming, on a portion of said non-doped insulating film and on said silicide wiring conductor, a first BPSG film having a thickness of not less than 50 nm but not greater than 200 nm;

performing a first heat-treatment on said first BPSG film;

forming, on said first BPSG film, a non-doped silicon oxide film by a chemical vapor deposition process using ozone and tetrethoxysilane;

performing a second heat-treatment on said non-doped silicon oxide film;

forming an insulative dummy layer on a surface of said non-doped silicon oxide film;

performing an etching-back treatment until said insulative dummy layer is completely removed, so that a surface of said non-doped silicon oxide film is planarized;

forming a second BPSG on said non-doped silicon oxide film after said etching-back treatment.

7. The method of claim 6, further comprising the step of forming an oxide gate film between said silicon substrate and said polysilicon wiring conductor, and between said diffusion layer and said non-doped insulating film.

* * * * *